(12) United States Patent
Lee et al.

(10) Patent No.: US 11,984,642 B2
(45) Date of Patent: May 14, 2024

(54) ELECTRONIC APPARATUS INCLUDING ANTENNA CONNECTION MEMBER

(71) Applicant: SAMSUNG ELECTRONICS CO., LTD., Suwon-si (KR)

(72) Inventors: Wonjae Lee, Suwon-si (KR); Minsoo Kim, Suwon-si (KR); Hyuntae Jung, Suwon-si (KR); Kiman Kim, Suwon-si (KR); Jiwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 322 days.

(21) Appl. No.: 17/436,479

(22) PCT Filed: Dec. 2, 2019

(86) PCT No.: PCT/KR2019/016834
§ 371 (c)(1),
(2) Date: Sep. 3, 2021

(87) PCT Pub. No.: WO2020/197037
PCT Pub. Date: Oct. 1, 2020

(65) Prior Publication Data
US 2022/0173498 A1    Jun. 2, 2022

(30) Foreign Application Priority Data

Mar. 26, 2019    (KR) .................. 10-2019-0034248

(51) Int. Cl.
*H05K 1/02* (2006.01)
*H01Q 1/24* (2006.01)
(Continued)

(52) U.S. Cl.
CPC .......... *H01Q 1/243* (2013.01); *H04M 1/0249* (2013.01); *H04M 1/0277* (2013.01); *H05K 1/181* (2013.01)

(58) Field of Classification Search
CPC .... H05K 1/181; H05K 5/0004; H05K 5/0047; H05K 1/02; H01Q 1/084; H01Q 1/38;
(Continued)

(56) References Cited

U.S. PATENT DOCUMENTS

| 5,722,055 A * | 2/1998 | Kobayashi ............ H04M 1/026 455/575.8 |
| 8,112,878 B1 * | 2/2012 | Ding .................... H05K 5/0004 269/319 |

(Continued)

FOREIGN PATENT DOCUMENTS

| JP | 2001-118623 | 4/2001 |
| JP | 2014-187498 | 10/2014 |

(Continued)

OTHER PUBLICATIONS

Korean Office Action dated Apr. 14, 2023 in corresponding Korean Patent Application No. 10-2019-0034248.

(Continued)

*Primary Examiner* — Xiaoliang Chen
(74) *Attorney, Agent, or Firm* — Nixon & Vanderhye, P.C.

(57) ABSTRACT

According to various embodiments, an electronic apparatus comprises: a housing including a front plate, a rear plate disposed facing a direction opposite the front plate, and a side bezel enclosing at least a portion of the space between the front plate and the rear plate; a circuit board disposed between the front plate and the rear plate; a first radiating conductor disposed to form at least a portion of the side bezel; a connection member comprising a conductive material disposed between the circuit board and the rear plate; and a processor or communication module comprising communication circuitry disposed on the circuit board. The connection member includes a first curved part provided on one end and contacting the circuit board, and a second (Continued)

curved part provided on another end and contacting the first radiating conductor, thereby electrically connecting the first radiating conductor to the circuit board. The processor or communication module can be configured to use the first radiating conductor to perform wireless communication in at least one frequency band.

12 Claims, 10 Drawing Sheets

(51) Int. Cl.

| | | |
|---|---|---|
| *H01Q 1/38* | (2006.01) | |
| *H01Q 1/40* | (2006.01) | |
| *H01Q 1/42* | (2006.01) | |
| *H01Q 1/44* | (2006.01) | |
| *H01Q 1/48* | (2006.01) | |
| *H01Q 1/52* | (2006.01) | |
| *H01Q 5/321* | (2015.01) | |
| *H01Q 5/335* | (2015.01) | |
| *H01Q 5/364* | (2015.01) | |
| *H01Q 5/378* | (2015.01) | |
| *H01Q 5/40* | (2015.01) | |
| *H01Q 9/42* | (2006.01) | |
| *H04M 1/02* | (2006.01) | |
| *H04M 1/26* | (2006.01) | |
| *H04M 1/272* | (2006.01) | |
| *H05K 1/18* | (2006.01) | |
| *H05K 5/04* | (2006.01) | |

(58) Field of Classification Search
CPC .. H01Q 1/40; H01Q 1/42; H01Q 1/44; H01Q 1/48; H01Q 1/52; H01Q 1/242; H01Q 1/243; H01Q 1/2283; H01Q 5/40; H01Q 5/321; H01Q 5/335; H01Q 5/364; H01Q 5/378; H01Q 9/0407; H01Q 9/0414; H01Q 9/0421; H01Q 9/0435; H01Q 9/045; H01Q 9/42; H04M 1/0249; H04M 1/0252; H04M 1/026; H04M 1/0272
USPC .......... 361/760; 455/128, 351, 575.5, 575.8; 343/700 MS, 702, 846, 873, 882, 906
See application file for complete search history.

(56) References Cited

U.S. PATENT DOCUMENTS

| | | | | |
|---|---|---|---|---|
| 10,594,351 | B2* | 3/2020 | Wang | G06F 1/1658 |
| 2002/0093457 | A1* | 7/2002 | Hamada | H01Q 1/40 |
| | | | | 343/702 |
| 2003/0146878 | A1* | 8/2003 | Mikkola | H01Q 9/0421 |
| | | | | 343/702 |
| 2004/0207558 | A1* | 10/2004 | Saito | H01Q 1/084 |
| | | | | 343/702 |
| 2008/0018552 | A1* | 1/2008 | Nakajima | H01Q 1/2258 |
| | | | | 343/882 |
| 2009/0256758 | A1* | 10/2009 | Schlub | H01Q 5/40 |
| | | | | 343/702 |
| 2011/0095963 | A1* | 4/2011 | Wu | H01Q 5/321 |
| | | | | 343/906 |
| 2011/0133995 | A1 | 6/2011 | Pascolini et al. | |
| 2012/0098712 | A1* | 4/2012 | Ishibana | H01Q 1/44 |
| | | | | 343/702 |
| 2014/0286252 | A1* | 9/2014 | Chang | H04B 1/03 |
| | | | | 370/329 |
| 2015/0062847 | A1 | 3/2015 | Park | |
| 2016/0056528 | A1 | 2/2016 | Yamashita et al. | |
| 2016/0254832 | A1* | 9/2016 | Yoo | H01Q 13/10 |
| | | | | 455/575.5 |
| 2016/0261028 | A1* | 9/2016 | Kim | H01Q 9/42 |
| 2016/0351998 | A1* | 12/2016 | Ahn | H01Q 5/378 |
| 2016/0360015 | A1 | 12/2016 | Lee et al. | |
| 2017/0094818 | A1* | 3/2017 | Kim | G06F 1/1698 |
| 2018/0310423 | A1 | 10/2018 | Koo et al. | |
| 2019/0058271 | A1 | 2/2019 | Ryu et al. | |
| 2019/0104212 | A1* | 4/2019 | Lee | H01Q 9/0435 |

FOREIGN PATENT DOCUMENTS

| | | |
|---|---|---|
| KR | 1999-0006977 | 2/1999 |
| KR | 10-1049545 | 7/2011 |
| KR | 10-1197425 | 11/2012 |
| KR | 10-2015-0028112 | 3/2015 |
| KR | 10-2016-0110074 | 9/2016 |
| KR | 10-2016-0143128 | 12/2016 |
| KR | 10-2017-0036360 | 4/2017 |
| KR | 10-2017-0048043 | 5/2017 |
| KR | 10-2017-0093022 | 8/2017 |

OTHER PUBLICATIONS

International Search Report for PCT/KR2019/016834 dated Mar. 10, 2020, 5 pages.
Written Opinion of the ISA for PCT/KR2019/016834 dated Mar. 10, 2020, 5 pages.
Office Action dated Oct. 25, 2023 in Korean Patent Application No. 10-2019-0034248 and English-language translation.

* cited by examiner

ELECTRONIC APPARATUS INCLUDING ANTENNA CONNECTION MEMBER

CROSS-REFERENCE TO RELATED APPLICATIONS

This application is a national stage of International Application No. PCT/KR2019/016834 designating the United States, filed on Dec. 2, 2019, in the Korean Intellectual Property Receiving Office and claiming priority to Korean Patent Application No. 10-2019-0034248, filed on Mar. 26, 2019, in the Korean Intellectual Property Office, the disclosures of which are incorporated by reference herein in their entireties.

BACKGROUND

Field

The disclosure relates to an electronic device, and for example, to an electronic device including an antenna connection member.

Description of Related Art

With the development of electronics, information, and communication technologies, various functions are being integrated into one electronic device. For example, a smart phone includes the function of an audio player, an imaging device, or an electronic notebook as well as a communication function, and more various functions may be implemented in the smart phone through additional installation of applications.

A user may search, select, and obtain more information by accessing a network, not limited to functions (e.g., applications) or information installed in an electronic device. In accessing the network, although a direct access method (e.g., wired communication) may provide fast and stable communication establishment, it may limit a use area to a fixed location or a certain range of space. In accessing the network, a wireless communication method has few restrictions on location or space and offers a transmission speed and stability gradually reaching the same level as the direct access method. In the future, the wireless access method is expected to establish faster and more stable communication than the direct access method.

For data transmission and reception, more antennas and more various types of antennas may be mounted in an electronic device to improve user convenience. For example, an antenna for bi-directional communication such as commercial communication network access, wireless local area network (w-LAN), near field communication (NFC), broadcasting, or an antenna for receiving broadcasting, signals from an earth satellite navigation system (e.g., global navigation satellite system (GNSS)), or wireless power may be provided in the electronic device.

As various types of antenna devices are mounted in one electronic device, user convenience may be improved. However, electromagnetic interference may occur between an antenna device (e.g., a radiation conductor or a signal wiring between the radiation conductor and a communication module) and an electronic component (e.g., a signal wiring, a processor, or a communication module for transmitting a control signal) in the electronic device, or between different antenna devices. The electromagnetic interference may degrade or distort the performance of the antenna device. In an example, when a sufficient distance is secured between the antenna device and other electronic components, electromagnetic interference may be suppressed and stable performance of the antenna device may be secured. However, there may be a limit in securing a distance between the antenna device and other electronic components in a miniaturized or lightweight electronic device such as a mobile communication terminal.

SUMMARY

Embodiments of the disclosure may provide a connection member (e.g., a connection piece comprising a conductive material) for securing a sufficient distance at least between a signal wiring between a radiation conductor and a communication module and other electronic components within a limited space, or an electronic device including the connection member.

Embodiments of the disclosure may provide an antenna connection member for creating a stable wireless communication environment, or an electronic device including the antenna connection member.

Embodiments of the disclosure may provide an antenna connection member for improving the degree of design freedom for a circuit board or an arrangement of structures in an interior space, or an electronic device including the antenna connection member.

According to various example embodiments of the disclosure, an electronic device may include: a housing including a front plate, a rear plate disposed to face a direction opposite the front plate, and a side bezel at least partially surrounding a space between the front plate and the rear plate, a circuit board disposed between the front plate and the rear plate, a first radiation conductor disposed to form at least a part of the side bezel structure, a connection member comprising a conductive material disposed between the rear plate and the circuit board, and a processor or a communication module comprising communication circuitry disposed on the circuit board. The connection member may include a first curved part at one end thereof contacting the circuit board, and a second curved part at another end thereof contacting the first radiation conductor and configured to electrically connect the first radiation conductor to the circuit board, and the processor or the communication module may be configured to perform wireless communication in at least one frequency band using the first radiation conductor.

According to various example embodiments of the disclosure, an electronic device may include: a housing including a front plate, a rear plate disposed to face a direction opposite the front plate, and a side bezel at least partially surrounding a space between the front plate and the rear plate, a circuit board disposed between the front plate and the rear plate, a display disposed between the front plate and the circuit board, a flexible printed circuit board extending from the display, a first radiation conductor disposed to form at least a part of the side bezel structure, a connection member comprising a conductive material disposed between the circuit board and the rear plate overlapping with a part of the flexible printed circuit board when viewed from a front of the electronic device, and including a flat plate-shaped fixing part, a first curved part extending curvedly from one end of the fixing part, and a second curved part extending curvedly from another end of the fixing part, wherein the first curved part contacts the circuit board and the second curved part contacts the first radiation conductor, and a processor or a communication module comprising communication circuitry disposed on the circuit board. The connection member may electrically connect the first radiation conductor to the circuit board, and the processor or the communication module may be configured to perform wireless communication in at least one frequency band using the first radiation conductor.

According to various example embodiments of the disclosure, an electronic device may include: a housing including a front plate, a rear plate disposed to face a direction opposite the front plate, and a side bezel at least partially surrounding a space between the front plate and the rear plate, a circuit board disposed between the front plate and the rear plate, a first radiation conductor disposed to form at least a part of the side bezel structure, and a first connection member comprising a conductive material disposed between the circuit board and the rear plate. The first connection member may include a first curved part at one end thereof contacting the circuit board and a second curved part at another end thereof, contacting the first radiation conductor, and configured to electrically connect the first radiation conductor to the circuit board.

According to various example embodiments of the disclosure, when a part of a side bezel structure in a housing is used as a radiation conductor in an electronic device, the radiation conductor may be electrically connected to a circuit board through a connection member disposed between a rear plate and the circuit board. For example, the connection member may not be disposed on the circuit board, and thus a partial region of the circuit board (e.g., a region in which a connection member is conventionally mounted) may be removed or used for mounting other electronic components therein. According to an embodiment, the connection member is disposed in a rear case at least partially facing the circuit board, thereby increasing the degree of design freedom for the circuit board. In an embodiment, since the connection member is disposed in a structure other than the circuit board, for example, in the rear case, the connection member may be sufficiently apart from another electronic component (e.g., a flexible printed circuit board connected to a display) in a limited inner space of the electronic device. For example, as the connection member is spaced from another electronic component by a sufficient distance, the degradation or distortion of wireless communication performance caused by electromagnetic interference may be suppressed, and a stable wireless communication environment may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
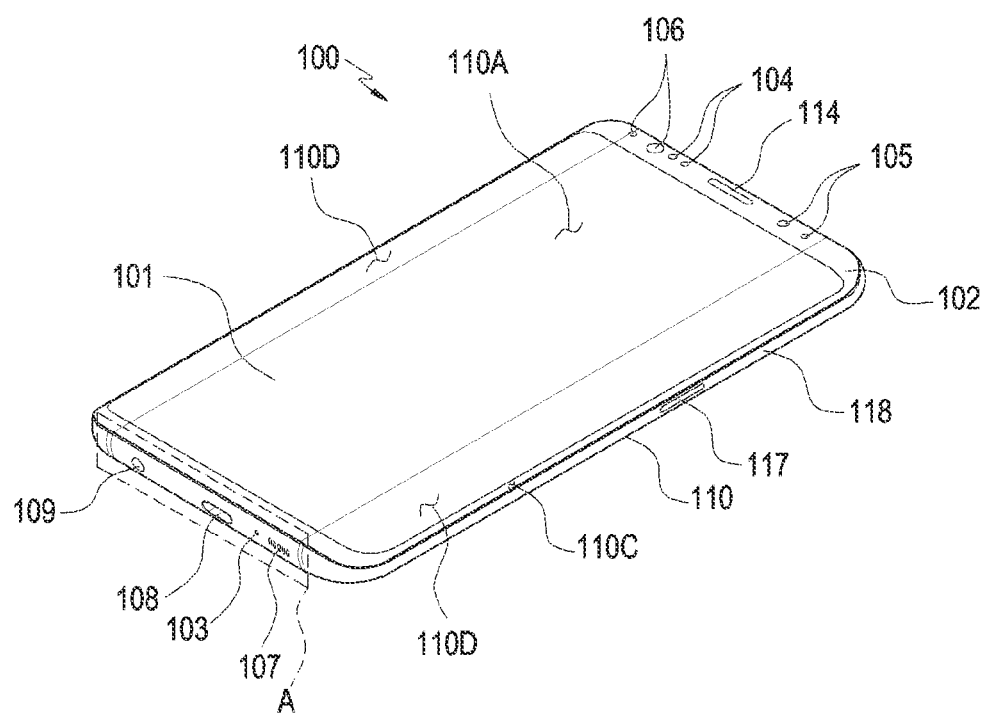
FIG. 1 is a front perspective view illustrating an electronic device according to various embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program) including one or more instructions that are stored in a storage medium (an internal memory or an external memory) that is readable by a machine (e.g., an electronic device). For example, a processor (e.g., a processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
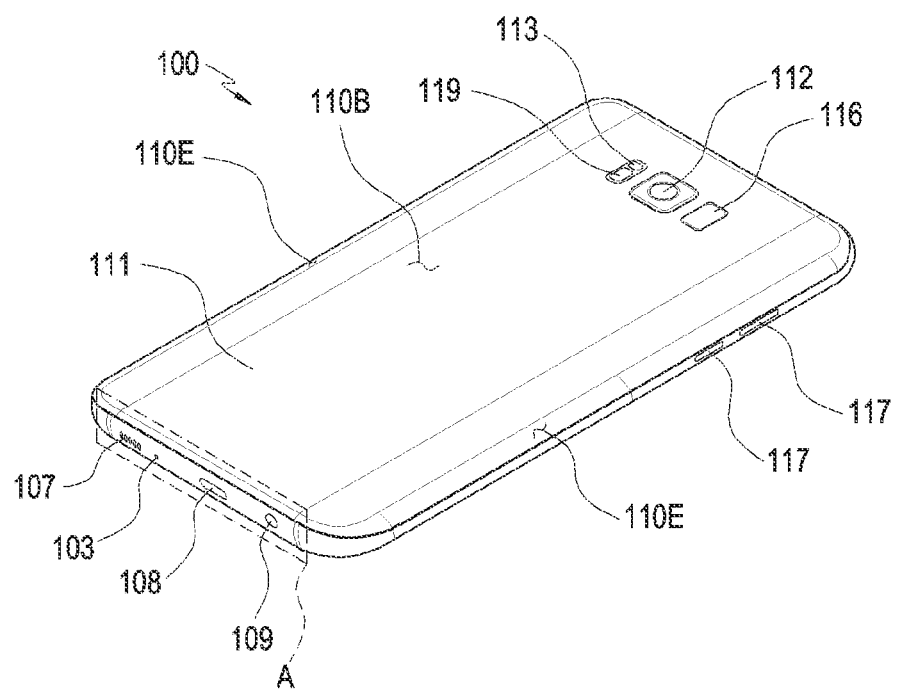
FIG. 2 is a rear perspective view illustrating the electronic device according to various embodiments.

FIG. 1 is a front perspective view illustrating an electronic device 100 according to various embodiments, and FIG. 2 is a rear perspective view illustrating the electronic device 100 according to various embodiments.

Referring to FIGS. 1 and 2, the electronic device 100 according to an embodiment may include a housing 110 including a first surface (or front surface) 110A, a second surface (or rear surface) 110B, and a side surface 110c surrounding a space between the first surface 110A and the second surface 110B. In an embodiment (not shown), the housing may refer to a structure forming a part of the first surface 110A, the second surface 110B, and the side surface 110C of FIG. 1. According to an embodiment, the first surface 110A may be formed by a front plate 102 (e.g., a glass plate or polymer plate including various coating layers) which is substantially transparent at least partially. The second surface 110B may be formed by a substantially opaque rear plate 111. The rear plate 111 may be formed of, for example, coated or colored glass, ceramic, a polymer, a metal (e.g., aluminum, stainless steel (STS), or magnesium), or a combination of at least two of these materials. The side surface 110C may be coupled with the front plate 102 and the rear plate 111 and formed by a side bezel structure (or "side member") 118 including a metal and/or a polymer. In some embodiments, the rear plate 111 and the side bezel structure 118 may be integrally formed and contain the same material (e.g., a metal such as aluminum).

In the illustrated embodiment, the front plate 102 may include, at both ends of long edges thereof, two first regions 110D which are bent and extend seamlessly from the first surface 110A toward the rear plate 111. In the illustrated embodiment (see FIG. 2), the rear plate 111 may include, at both ends of long edges thereof, two second regions 110E which are bent and extend seamlessly from the second surface 110B toward the front plate 102. In some embodiments, the front plate 102 (or the rear plate 111) may include only one of the first regions 110D (or the second regions 110E). In other embodiments, a part of the first regions 110D or the second regions 110E may not be included. In the above embodiments, when viewed from a side surface of the electronic device 100, the side bezel structure 118 may have a first thickness (or width) at side surfaces that do not include the first regions 110D or the second regions 110E and a second thickness smaller than the first thickness at side surfaces including the first regions 110D or the second regions 110E.

According to an embodiment, the electronic device 100 may include at least one of a display 101, audio modules 103, 107, and 114, sensor modules 104, 116, and 119, camera modules 105, 112, and 113, key input devices 117, light emitting elements 106, or connector holes 108 and 109. In some embodiments, the electronic device 100 may not be provided with at least one (e.g., the key input device 117 or the light emitting element 106) of the components or may additionally include other components.

The display 101 may be visible, for example, through a substantial part of the front plate 102. In some embodiments, at least a part of the display 101 may be visible through the front plate 102 forming the first surface 110A and the first regions 110D of the side surface 110C. In some embodiments, the corners of the display 101 may be formed into the substantially same shapes as those of adjacent outer peripheral portions of the front plate 102. In other embodiments (not shown), to expand an area over which the display 101 is visible, the distance between the outer periphery of the display 101 and the outer periphery of the front plate 102 may be substantially the same.

In other embodiments (not shown), a recess or opening may be formed in a part of a screen display area of the display 101, and at least one of the audio module 114, the sensor module 104, the camera module 105, or the light emitting elements 106 aligned with the recess or the opening may be included. In other embodiments (not shown), the display 101 may be combined with or disposed in vicinity of a touch sensing circuit, an input sensor for measuring the strength (pressure) of a touch, and/or a digitizer for detecting a magnetic field-type stylus pen. In some embodiments, at least some of the sensor modules 104 and 119 and/or at least some of the key input devices 117 may be disposed in the first regions 110D, and/or the second regions 110E.

The audio modules 103, 107, and 114 may include a microphone hole 103 and speaker holes 107 and 114. In the microphone hole 103, a microphone for obtaining an external sound may be disposed, and in some embodiments, a plurality of microphones may be disposed to detect the direction of a sound. The speaker holes 107 and 114 may include an external speaker hole 107 and a receiver hole 114 for a call. In some embodiments, the speaker holes 107 and 114 and the microphone hole 103 may be implemented as a single hole, or a speaker (e.g., a piezo speaker) may be included without the speaker holes 107 and 114.

The sensor modules 104, 116, and 119 may generate an electrical signal or a data value corresponding to an internal operating state of the electronic device 100 or an external environmental state. The sensor modules 104, 116, and 119 may include, for example, a first sensor module 104 (e.g., a proximity sensor) and/or a second sensor module (not shown) (e.g., a fingerprint sensor), and/or a third sensor module 119 (e.g., an HRM sensor) disposed on the second surface 110B of the housing 110 and/or a fourth sensor module 116 (e.g., a fingerprint sensor). The fingerprint sensor may be disposed on the second surface 110B as well as the first surface 110A (e.g., the display 101) of the housing 110. The electronic device 100 may further include at least one of sensor modules which are not shown, for example, a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112, and 113 may include a first camera device 105 disposed on the first surface 110A of the electronic device 100, and a second camera device 112 and/or a flash 113 disposed on the second surface 110B of the electronic device 100. Each of the camera devices 105 and 112 may include one or more lenses, an image sensor, and/or an image signal processor. The flash 113 may include, for example, a light emitting diode (LED) or a xenon lamp. In some embodiments, two or more lenses (an IR camera and wide-angle and telephoto lenses) and image sensors may be disposed on one surface of the electronic device 100.

The key input devices 117 may be disposed on the side surface 110C of the housing 110. In other embodiments, the electronic device 100 may not include some or any of the above-mentioned key input devices 117, and a key input device 117 which is not included may be implemented in a different form such as a soft key on the display 101. In some embodiments, the key input devices may include the sensor module 116 disposed on the second surface 110B of the housing 110.

The light emitting elements 106 may be disposed, for example, on the first surface 110A of the housing 110. The light emitting elements 106 may provide, for example, state information about the electronic device 100 in the form of light. In other embodiments, the light emitting elements 106 may provide, for example, a light source operating in conjunction with the operation of the camera module 105. The light emitting elements 106 may include, for example, an LED, an IR LED, and a xenon lamp.

The connector holes 108 and 109 may include a first connector hole 108 for accommodating a connector (e.g., a USB connector) for transmitting and receiving power and/or data to and from an external electronic device, and/or a second connector hole (e.g., earphone jack) 109 for accommodating a connector for transmitting and receiving audio signals to and from an external electronic device.

Figure 3:
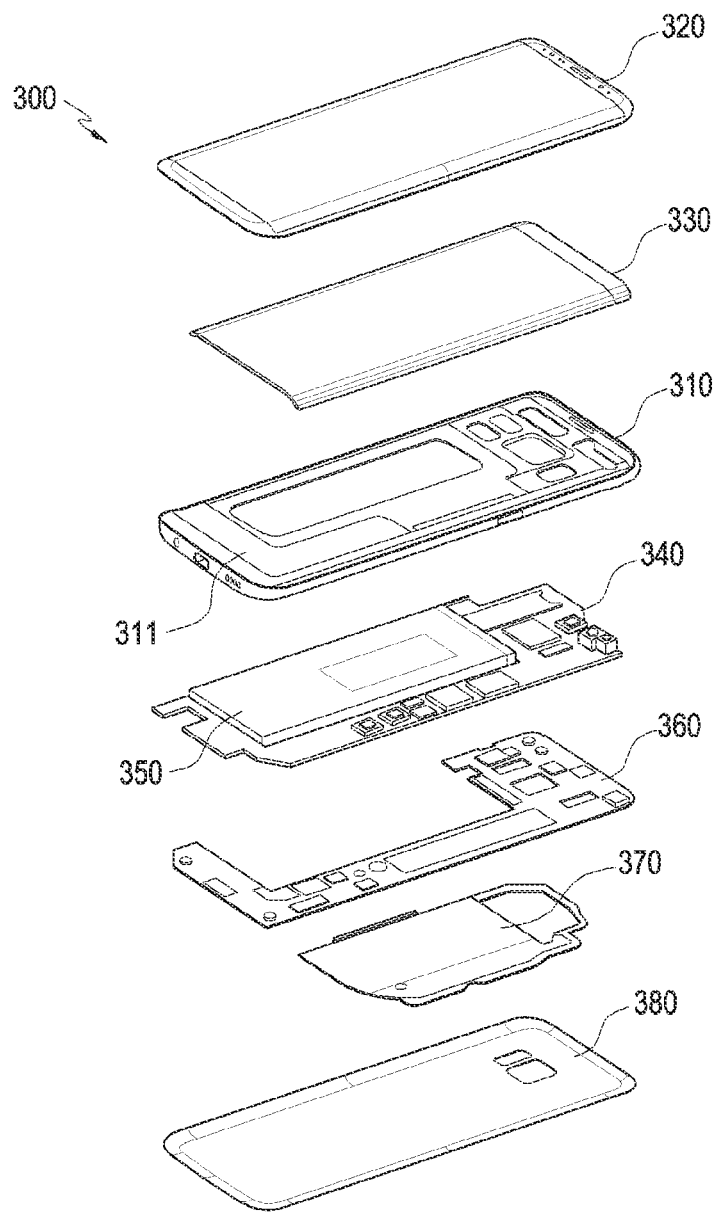
FIG. 3 is an exploded perspective view illustrating the electronic device according to various embodiments.

FIG. 3 is an exploded perspective view illustrating an electronic device 300 (e.g., the electronic device 100 illustrated in FIG. 1 or FIG. 2) according to various embodiments.

Referring to FIG. 3, the electronic device 300 may include a side bezel structure 310, a first support member 311 (e.g., a bracket), a front plate 320, a display 330, and a printed circuit board 340, a battery 350, a second support member 360 (e.g., a rear case), an antenna 370, and a rear plate 380. In some embodiments, at least one (e.g., the first support member 311 or the second support member 360) of the components may be omitted in or other components may be added to the electronic device 300. At least one of the components of the electronic device 300 may be identical or similar to at least one of the components of the electronic device 100 of FIG. 1 or FIG. 2, and a redundant description may not be repeated below.

The first support member 311 may be disposed inside the electronic device 300 and connected to the side bezel structure 310 or may be integrally formed with the side bezel structure 310. The first support member 311 may be formed of, for example, a metal and/or a non-metal (e.g., polymer). The first support member 311 may have one surface coupled with the display 330 and the other surface coupled with the printed circuit board 340. A processor, a memory, and/or an interface may be mounted on the printed circuit board 340. The processor may include, for example, at least one of a central processing unit (CPU), an application processor, a graphics processing unit, an image signal processor, a sensor hub processor, or a communication processor.

The memory may include, for example, a volatile memory or a non-volatile memory.

The interface may include, for example, a high definition multimedia interface (HDMI), a universal serial bus (USB) interface, an SD card interface, and/or an audio interface. The interface may, for example, electrically or physically connect the electronic device 300 to an external electronic device, and may include a USB connector, an SD card/MMC connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed substantially on the same plane as the printed circuit board 340, for example. The battery 350 may be integrally disposed inside the electronic device 300 or may be disposed detachably from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may, for example, perform short-range communication with an external device or wirelessly transmit/receive power required for charging. In other embodiments, an antenna structure may be formed by a part of the side bezel structure 310 and/or the first support member 311, or a combination thereof.

In the following detailed description, the same reference numerals as in the foregoing embodiment are assigned to or omitted for components that may be easily understood through the foregoing embodiment, and their detailed description may also be omitted.

Figure 4:
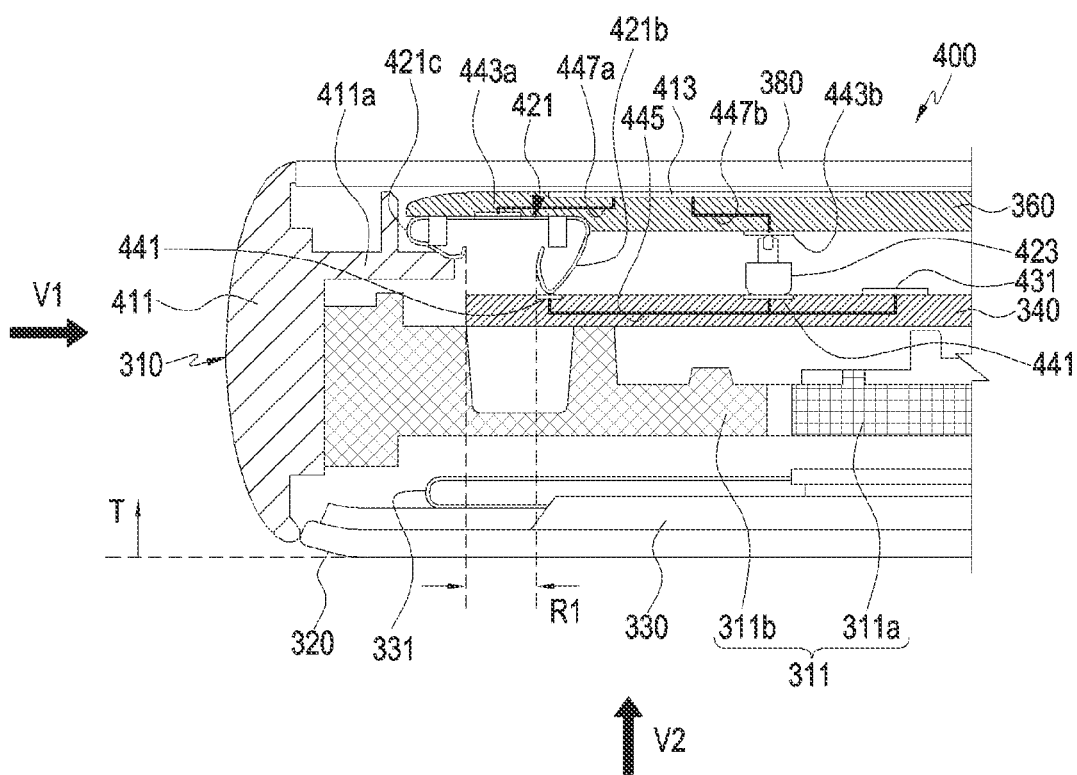
FIG. 4 is a cross-sectional view illustrating the electronic device according to various embodiments.
Figure 5:
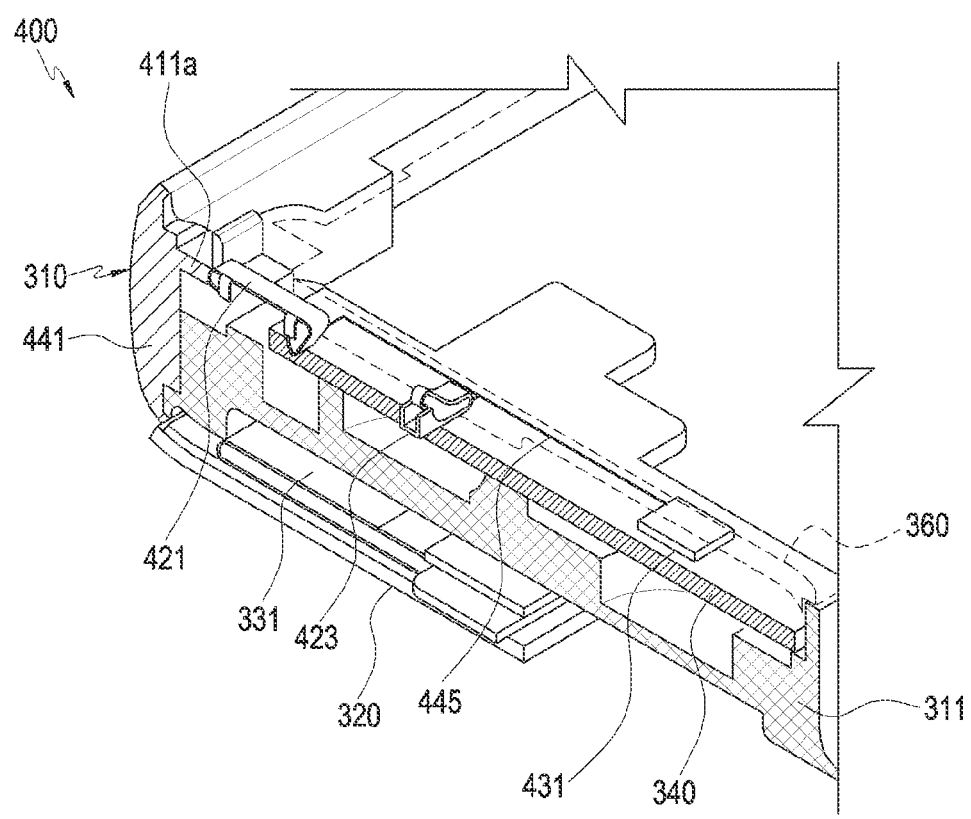
FIG. 5 is a perspective view illustrating a cut part of the electronic device according to various embodiments.

FIG. 4 is a cross-sectional view illustrating an electronic device 400 (e.g., the electronic devices 100 and 300 of FIGS. 1, 2 and 3) according to various embodiments. FIG. 5 is a perspective view illustrating a cut part of the electronic device 400 according to various embodiments.

Referring to FIGS. 4 and 5, the electronic device 400 may include a side bezel structure (e.g., the side bezel structure 310 of FIG. 3) that at least partially surrounds a space between a front plate (e.g., the front plate 320 of FIG. 3) and a rear plate (e.g., the rear plate 380 of FIG. 3). The side bezel structure 310 may be integrally formed with the first support member 311, and a part of the side bezel structure 310 or the first support member 311 may be made of a conductive material, and the other part thereof may be made of a non-conductive material. According to an embodiment, the part of the side bezel structure 310, made of the conductive material may be provided as a part of an antenna device, for example, as a first radiation conductor 411. For example, the first radiation conductor 411 may be formed of a conductive material and form at least a part of the side bezel structure 310.

According to various embodiments, in the structure in which the side bezel structure 310 and the first support member 311 are integrally formed, the side bezel structure 310 and the first support member 311 may be at least partially formed of a metal (e.g., a conductive material), thereby securing the rigidity of the electronic device 400. In an embodiment, when a part of the conductive material part of the side bezel structure 310 (e.g., a part indicated by 'A' in FIG. 1 or FIG. 2) is used as the first radiation conductor 411, the first radiation conductor 411 may be isolated from other conductive material parts of the side bezel structure 310 and the first support member 311. For example, the side bezel structure 310 or the first support member 311 may include a non-conductive material part that isolates the first radiation conductor 411 from the other conductive material parts. In FIG. 4, the first radiation conductor 411 is isolated from a conductive material part 311a of the first supporting member 311 by a non-conductive material part 311b of the first supporting member 311. In an embodiment, the non-conductive material part 311b may mechanically connect or couple the first radiation conductor 411 to the conductive material part 311a, while isolating the first radiation conductor 411 from the conductive material part 311a. In an embodiment, the non-conductive material part 311b may at least partially include an opening region, which may provide a space for accommodating another electronic component (e.g., a camera module or various sensor modules) within the electronic device 400.

According to various embodiments, the electronic device 400 may include a circuit board (e.g., the circuit board 340 of FIG. 3) and a first connection member 421. The circuit board 340 may be disposed in the space surrounded by the side bezel structure 310, for example, between the front plate 320 and the rear plate 380, and the first connection member 421 may electrically connect the first radiation conductor 411 to the circuit board 340. According to an embodiment, an integrated circuit chip, for example, an integrated circuit chip 431 with a processor or communication module mounted thereon may be mounted on the circuit board 340, and the processor or communication module may be configured to perform wireless communication in at least one frequency band using the first radiation conductor 411. According to various embodiments, the first connection member 421 may be disposed between the circuit board 340 and the rear plate 380. For example, a part of the circuit board 340 may be disposed between the front plate 320 and the first connection member 421.

The first connection member 421 will be described in greater detail below with reference to FIGS. 6 and 7.

Figure 6:
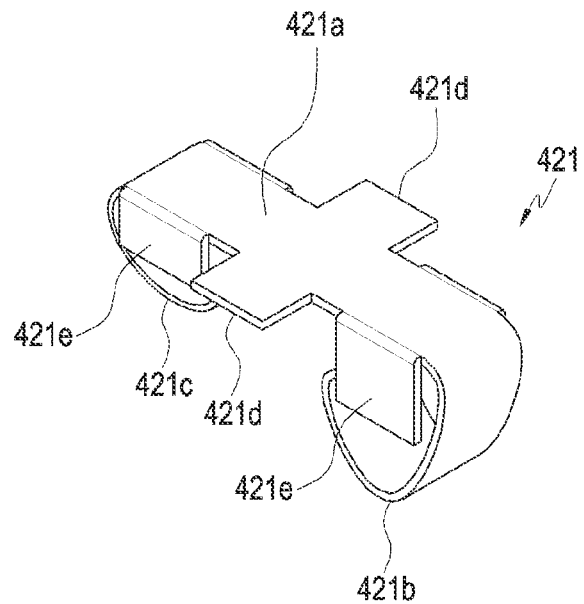
FIG. 6 is a perspective view illustrating a first connection member in the electronic device according to various embodiments.
Figure 7:
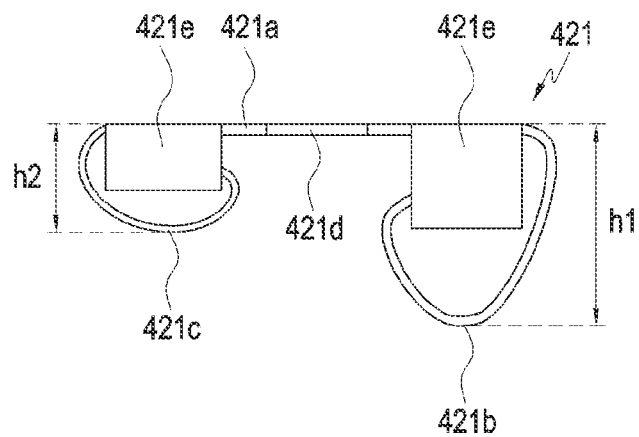
FIG. 7 is a diagram illustrating a side view of the first connection member in the electronic device according to various embodiments.

FIG. 6 is a perspective view illustrating the first connection member 421 in an electronic device (e.g., the electronic device 400 of FIG. 4) according to various embodiments. FIG. 7 is a side view illustrating the first connection member 421 in the electronic device according to various embodiments.

Referring to FIGS. 4, 5, 6 and 7, the first connection member 421 may include a fixing part 421a and curved parts 421b and 421c extending from both ends of the fixing part 421a, respectively. The fixing part 421a may be shaped into a flat plate and used as a structure to be mounted or fixed inside the electronic device 400. According to an embodiment, one of the curved parts may be a first curved part 421b bent and extending from one end of the fixing part 421a to be in contact with the circuit board 340, and the other curved part may be a second curved part 421c bent and extending from the other end the fixing part 421a to be in contact with the first radiation conductor 411. For example, the first curved part 421b and/or the second curved part 421c may be formed to at least partially face the fixing part 421a. In an embodiment, the first curved part 421b and the second curved part 421c may extend in a direction in which as they are father from one end of the fixing part 421a, they are closer to each other. When the first curved part 421b and the second curved part 421c are disposed in the electronic device (e.g., the electronic devices 100, 300, and 400 of FIGS. 1, 2, 3 and 4), they may extend from the fixing part 421a toward a front plate (e.g., the front plate 330 of FIG. 3).

According to various embodiments, the first connection member 421 may be formed of a conductive material to electrically connect the first radiation conductor 411 to the circuit board 340 (e.g., the integrated circuit chip 431). As the first curved part 421b and the second curved part 421c have elasticity, they may accumulate a certain amount of elastic force while being in contact with the circuit board 340 and/or the first radiation conductor 411. For example, the first connection member 421 may be stably kept in contact with the circuit board 340 and/or the first radiation conductor 411. In an embodiment, the integrated circuit chip 431, for example, the processor or the communication module may be electrically connected to the first radiation conductor 411 through a first signal wiring 445 (e.g., a printed circuit pattern) formed on the circuit board 340 and/or the first connection member 421.

According to various embodiments, the first curved part 421b may have a first height h1 from the fixing part 421a, and the second curved part 421c may have a second height h2 from the fixing part 421a, in a thickness direction T of the electronic device 400. The "thickness direction T of the electronic device" may refer to a direction in which the distance between the outer surface of the front plate 320 and the outer surface of the rear plate 380 is measured. According to an embodiment, the second height h2 may be different from the first height h1. For example, the second height h2 may be smaller than the first height h1. When the second height h2 is smaller than the first height h1, the first connection member 421 may contact the circuit board 340 at a point farther from the fixing part 421a than a point at which the first connection member 421 contacts the first radiation conductor 411.

According to various embodiments, the first connection member 421 may further include at least one first support piece 421d and/or at least one second support piece 421e. In an embodiment, the first support piece 421d may extend from at least one edge of the fixing part 421a and form a flat plate together with the fixing part 421a. For example, when the first connection member 421 is fixed inside the electronic device 400, the first support piece 421d may be used together with the fixing part 421a as a structure for more stably fixing the first connection member 421. In some embodiments, the first support piece 421d may be bent to be perpendicular or inclined to the fixing part 421a in a direction opposite to the second support piece 321e. For example, the first support piece 421d may be engaged with the rear plate 380 or the rear case 360, or may be embedded into the rear plate 380 or the rear case 360.

According to various embodiments, the second support piece 421e may extend from at least one edge of the fixing part 421a to be inclined or perpendicular to the fixing part 421a. The second support piece 421e may be disposed adjacent to the first curved part 421b and/or the second curved part 421c, and have a smaller height than the first curved part 421b and/or the second curved part 421c in the thickness direction T of the electronic device 400. According to an embodiment, when the first curved part 421b and/or the second curved part 421c is deformed by contacting another structure, the second support piece(s) 421e may prevent and/or reduce excessive deformation of the first curved part 421b and/or of the second curved part 421c. For example, as the second support piece(s) 421e comes into contact with another structure, the second support piece(s) 421e may prevent and/or reduce further deformation of the first curved part 421b and/or the second curved part 421c.

According to various embodiments, the electronic device 400 may further include a rear case (e.g., the second support member or the rear case 360 of FIG. 3) disposed between the rear plate 380 and the circuit board 340. In an embodiment, the first connection member 421 may be disposed on one surface of the rear case 360 to at least partially directly face the circuit board 340. For example, as the fixing part 421a is mounted or fixed to the rear case 360, the first curved part 421b may be disposed to face a part of the circuit board 340, and the second curved part 421c may be disposed to face a part of the first radiation conductor 411. For example, the first curved part 421b may contact the circuit board 340, and the second curved part 421c may contact the first radiation conductor 411.

According to various embodiments, at least one first conductive pad 441 may be disposed on the circuit board 340, and the first radiation conductor 411 may include at least one contact piece 411a extending from the inner surface of the side bezel structure 310. The first radiation conductor 411 may include a plurality of contact pieces 411a, and when one contact piece 411a is used as a feeding point, another contact piece 411a may be used as a grounding point (or a shorting pin). According to an embodiment, the first conductive pad 441 may be connected to the integrated circuit chip 431 (e.g., the processor or the communication module) through the first signal wiring 445, and the first curved part 421b may contact the first conductive pad 441. The contact piece 411a may be a part of the first radiation conductor 411 and/or the side bezel structure 310, and extend in parallel with the front plate 320 and/or the rear plate 380 to contact the second curved part 421c. "Parallel" may refer, for example, to the front plate 320 and the contact piece 411a being parallel. In some embodiments, "parallel" may refer, for example, to that although the front plate 320 and the contact piece 411a being substantially parallel, a part of the contact piece 411a or a part of a surface of the contact piece 411a may be inclined with respect to the front plate 320.

According to various embodiments, as the first curved part 421b and the second curved part 421c come into contact with the circuit board 340 (e.g., the first conductive pad 441) and/or the contact piece 411a, the first curved part 421b and the second curved part 421c may be deformed to a certain extent and accumulate elastic force. In an embodiment, in the structure in which the second curved part 421c has a smaller height than the first curved part 421b, the distance between the contact piece 411a and the rear plate 380 may be smaller than the distance between the circuit board 340 and the rear plate 380. For example, the contact piece 411a may be disposed closer to the rear plate 380 than to the circuit board 340. In some embodiments, when viewed from the outside of the first radiation conductor 411 in an arrowed direction V1, the contact piece 411a may be disposed between the circuit board 340 and the rear plate 380 or between the first connection member 421 and the circuit board 340. Accordingly, even though the second curved part 421c has a smaller height than the first curved part 421b, the first connection member 421 may electrically connect the first radiation conductor 411 to the circuit board 340.

According to various embodiments, the electronic device 400 may further include a display (e.g., the display 330 of FIG. 3) and a flexible printed circuit board 331. The display 330 may be disposed between the front plate 320 and the circuit board 340, and may be integrated into the front plate 320 according to an embodiment. According to an embodiment, the flexible printed circuit board 331 may extend from one side of the display 330 and transmit power and/or a control signal to the display 330. In some embodiments, when a touch panel is integrated in the display 330, a user input signal may be transmitted through the flexible printed circuit board 331. In an embodiment, when viewed from the front of the electronic device 400 in an arrowed direction V2, a part of the flexible printed circuit board 331 may overlap with the first connection member 421.

According to various embodiments, the first connection member 421 may transmit a signal for performing wireless communication between the first radiation conductor 411 and the processor or the communication module (e.g., the integrated circuit chip 431). The flexible printed circuit board 331 may transmit a signal for controlling the display 330 or a signal according to a user input. In an embodiment, electromagnetic interference may occur between the first connection member 421 and the flexible printed circuit board 331 according to transmissions of various signals. Although a general connection member may be mounted on the circuit board 340 usually in a first area R1, the first connection member 421 may be mounted on the rear case 360 to electrically connect the first radiation conductor 411 to the circuit board 340 according to various embodiments of the disclosure. For example, the first connection member 421 may be disposed farther from the flexible printed circuit board 331 than in the general mounting structure. As the first connection member 421 is mounted in the rear case 360, electromagnetic interference which may occur between the first connection member 421 and the flexible printed circuit board 331 may be mitigated, compared to the general mounting structure. In an embodiment, the contact piece 411a serving as a feeding point of the first radiation conductor 411 may be spaced from the flexible printed circuit board 331 by a predetermined distance according to the height of the second curved part 421c (e.g., the second height h2 in FIG. 7). For example, as the height h2 of the second curved part 421c is smaller, the contact piece 411a may be disposed farther from the flexible printed circuit board 311, thereby mitigating electromagnetic interference between the feeding point of the first radiation conductor 411 and the flexible printed circuit board 331.

According to various embodiments, as the first connection member 421 is mounted in the rear case 360, an area in which other electronic components may be mounted on the circuit board 340 may be increased, or at least the circuit board 340 may be miniaturized. In an embodiment, when the first connection member 421 is mounted in the first area R1 of the circuit board 340, the contact piece 411a may extend at least to a position at which the contact piece 411a faces the first area R1. For example, when the first connection member 421 is mounted on the circuit board 340, the contact piece 411a may be formed to overlap with a part (e.g., the first area R1) of the circuit board 340, when viewed from the front of the electronic device in the arrowed direction V2. According to various embodiments of the disclosure, since the first connection member 421 is mounted in the rear case 360, the contact piece 411a does not need to overlap with the circuit board 340. For example, the degree of design freedom related to the shape, size, or position of the contact piece 411a and/or the circuit board 340 may be increased. According to an embodiment, the degree of freedom in designing the contact piece 411a or the circuit board 340 may be further increased according to the shape, size, and/or position of the first connection member 421.

While the structure in which the first connection member 421 is mounted in the rear case 360 has been described with reference to FIGS. 4, 5, 6 and 7 by way of example, the disclosure is not limited thereto. For example, the electronic device (e.g., the electronic devices 100, 300, and 400 of FIGS. 1 to 4) may not include the rear case, or even though it does, the first connection member 421 may be mounted on a different structure, for example, the rear plate 380. As the first connection member 421 is mounted on a structure (e.g., the rear case 360 or the rear plate 380) other than the circuit board 340, the first connection member 421 may be disposed at a sufficient distance from the display 330 and/or the flexible printed circuit board 331.

According to various embodiments, the electronic device 400 may further include a second radiation conductor 413 disposed in the rear case 360. The second radiation conductor 413 may be formed on the surface of the rear case 360 by a laser direct structure (LDS), a printed circuit pattern (e.g., a flexible printed circuit board), or a copper foil. The second radiation conductor 413 may be disposed together with the first connection member 421 on one surface of the rear case 360 (e.g., the surface facing the front surface of the electronic device 400) or on the other surface of the rear case 360 (e.g., the surface facing the rear surface of the electronic device 400), unlike the first connection member 421. As the second radiation conductor 413 is disposed on the other surface of the rear case 360, electromagnetic interference to other electronic components may be mitigated.

According to various embodiments, the second radiation conductor 413 may be electrically connected to the first connection member 421 through a second signal wiring 447a formed in the rear case 360. According to an embodiment, a second conductive pad 443a may be disposed on the rear case 360, which is coupled with the first connection member 421 and electrically connects the second signal wiring 447a to the first connection member 421. For example, the first connection member 421 may be electrically connected to the second conductive pad 443a while mechanically connected to the second conductive pad 443a by a method such as laser fusion or ultrasonic fusion. In an embodiment, the second radiation conductor 413 may be electrically connected to the processor or the communication module (e.g., the integrated circuit chip 431) through the first connection member 421 and perform wireless communication together with the first radiation conductor 411 in at least one frequency band.

According to various embodiments, the second radiation conductor 413 may be electrically connected to the processor or the communication module through a connection member (e.g., the second connection member 423) other than the first connection member 421. For example, separately from the first connection member 421, the second connection member 423 may be mounted on the circuit board 340 while being connected to the first conductive pad 441, and a third conductive pad 443b corresponding to the second connection member 423 may be provided in the rear case 360. The third conductive pad 443b may be provided, for example, as a contact pad corresponding to the second connection member 423. In an embodiment, the third conductive pad 443b may be electrically connected to the second radiation conductor 413 through a third signal wiring 447b provided in the rear case 360. For example, the second connection member 423 may be mounted on the circuit board 340 and may be electrically connected to the second radiation conductor 423 by contacting the third conductive pad 443b. In some embodiments, the second radiation conductor 413 may be electrically connected to the circuit board 340 through the first connection member 421 and the second connection member 423. In the embodiment illustrated in FIG. 4, the second connection member 423 is shown as a structure connected to the communication module (e.g., the integrated circuit chip 431), which should not be construed as limiting the disclosure. For example, the second connection member 423 may be electrically connected to a ground (e.g., a ground plane or a ground conductor) built in the circuit board 340 rather than the communication module. Antenna structures of various shapes, for example, a monopole antenna, a dipole antenna, an inverted-F antenna, or a loop antenna may be implemented depending on the shape or connection position of the first connection member 421, the second connection member 423, the first radiation conductor 411, and/or the second radiation conductor 413.

According to various embodiments, when electrically connected to the processor or the communication module through the second connection member 423, the second radiation conductor 413 may not be electrically connected to the first connection member 421. For example, when the second radiation conductor 413 is electrically connected to the processor or the communication module through the second connection member 423, the second radiation conductor 413 may perform wireless communication independently of the first radiation conductor 411. In an embodiment, when performing wireless communication independently of the first radiation conductor 411, the second radiation conductor 413 may transmit and receive radio signals in the same frequency band as that of the first radiation conductor 411 to implement a multi-input/multi-output (MIMO) function, or transmit and receive radio signals in a frequency band different from that of the first radiation conductor 411.

Figure 8:
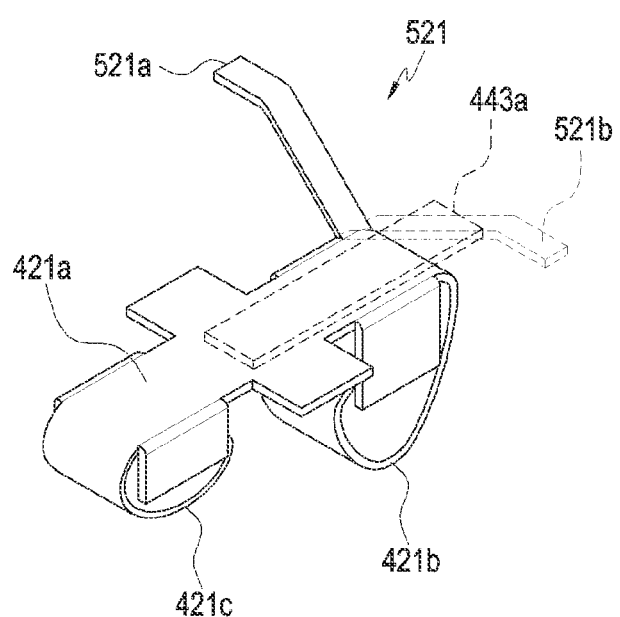
FIG. 8 is a perspective view illustrating an example of the first connection member in the electronic device according to various embodiments.
Figure 9:
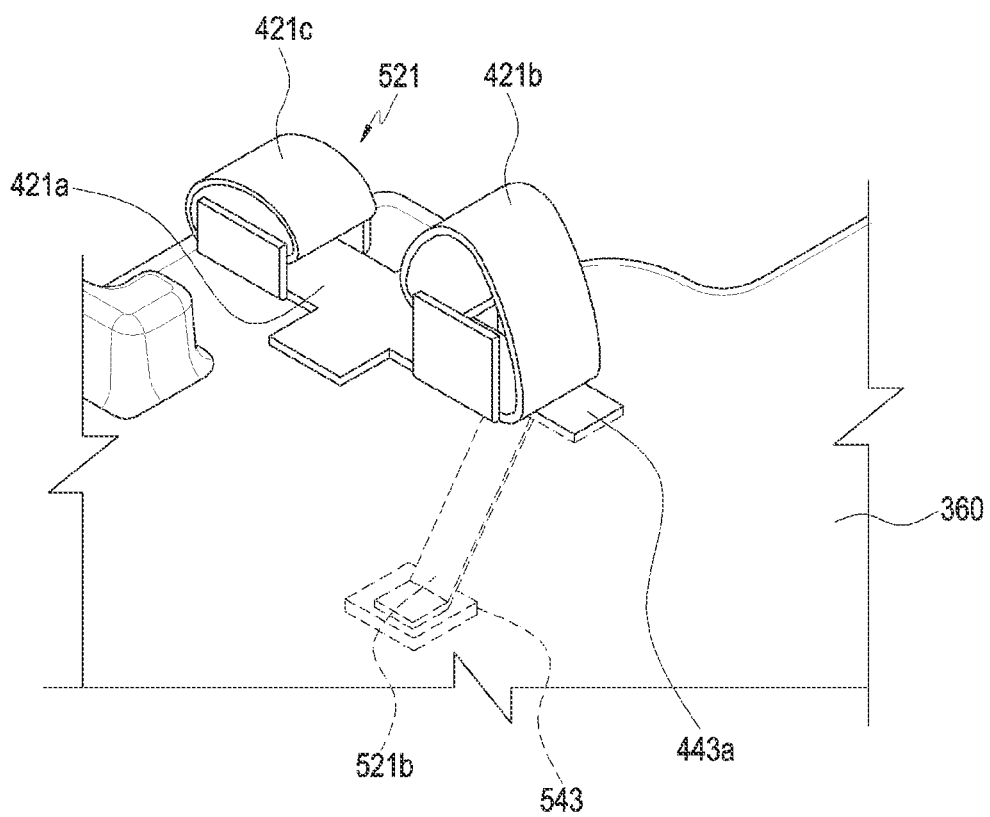
FIGS. 9 and 10 are perspective views illustrating the first connection member installed in the electronic device according to various embodiments.
Figure 10:
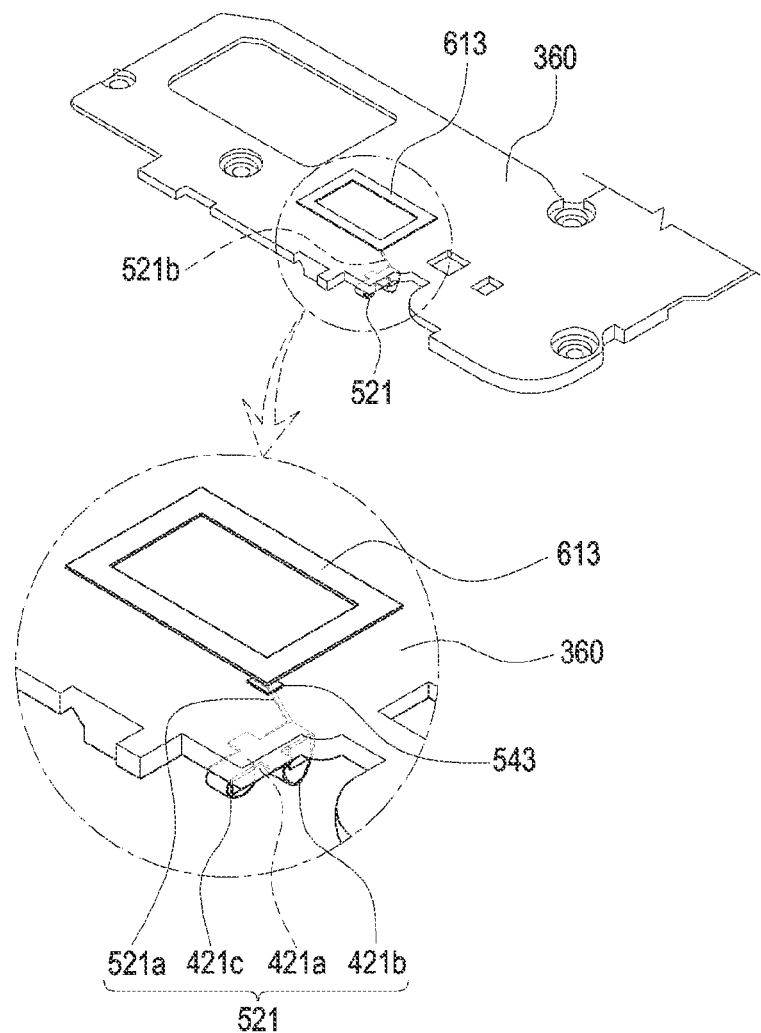

With reference to FIGS. 8, 9 and 10, various structures connecting the first connection member 421 to the second radiation conductor 413 will be described in greater detail below.

FIG. 8 is a perspective view illustrating an example of the first connection member (e.g., the first connection member 421 of FIG. 6) in the electronic device according to various embodiments.

In this embodiment, a first connection member 521 may be different from the first connection member 421 of the foregoing embodiment in that the former further includes an extension piece 521a. The extension piece 521a may extend from at least one edge of the fixing part 421a and be inclined with respect to the fixing part 421a. According to an embodiment, the extension piece 521a may extend away from an area or space facing the fixing part 421a depending on the relative positions of the first connection member 521 and a second radiation conductor (e.g., the second radiation conductor 413 of FIG. 4). In an embodiment, the extension piece may extend in a direction to be disposed at least partially in the area or space facing the fixing part 421a, as indicated by reference numeral '521b'. In one embodiment, the extension piece 521a may be embedded in the rear case 360, and when the first connection member 521 is mounted on one surface of the rear case 360, an end portion of the extension piece 521a may be exposed from the other surface of the rear case 360. For example, according to an embodiment, even though the second conductive pad 443a and/or the second signal wiring 447a of FIG. 4 is not provided, the first connection member 521 may be electrically connected to the second radiation conductor 413 of FIG. 4 by contacting the second radiation conductor 413 through the extension piece 521a.

FIGS. 9 and 10 are perspective views illustrating the first connection member 521 mounted in the electronic device according to various embodiments.

With further reference to FIGS. 9 and 10, the extension piece 521b may be disposed to penetrate through the rear case 360 to serve as a second signal wiring (e.g., the second signal wiring 447a of FIG. 4). For example, when the first connection member 521 (e.g., the first connection member 421 of FIG. 4) and a second radiation conductor 613 (e.g., the second radiation conductor 413 of FIG. 4) are disposed on different surfaces of the rear case 360, a part of the extension piece 521a may be disposed in contact with the second radiation conductor 613, thereby enabling the first connection member 521 to be electrically connected to the second radiation conductor 613. In electrically connecting the first connection member 521 to the second radiation conductor 613, an electronic device (e.g., the electronic devices 100, 2300, and 400 of FIGS. 1 to 4) may further include a fourth conductive pad 543. For example, the fourth conductive pad 543 may be provided on the surface of the rear case 360, on which the second radiation conductor 613 is disposed. According to various embodiments, the extension piece 521a may be electrically connected to the fourth conductive pad 543 without being substantially exposed from the surface of the rear case 360, and the fourth conductive pad 543 may be disposed at least partially in contact with the second radiation conductor 613.

According to various embodiments, when the rear case 360 is manufactured by injection molding of a synthetic resin, the rear case 360 may be molded by insert injection, and at the same time, the first connection member 521 may be mounted in the rear case 360. In an embodiment, in the case of a separate assembled structure, with the rear case 360 molded, a space such as a through hole may be provided so that the extension piece 521a may be disposed to penetrate through the rear case 360. Depending on the process or structure of mounting the first connection member 521 to the rear case 360, various mechanisms are available for electrically connecting the first connection member 521 to the second radiation conductor 613.

According to various embodiments, the extension piece 521a may be replaced with a structure other than the metal plate forming the first connection member 521. For example, a laser direct structure, a printed circuit pattern, or a copper foil formed on (or attached to) the surface of the rear case 360 or the inner wall of the hole penetrating the rear case 360 may be provided as a second signal wiring (e.g., the second signal wiring 447a of FIG. 4). When the extension piece 521a provided as the second signal wiring is replaced with the laser direct structure, the printed circuit pattern, or the copper foil, the second conductive pad 443a may be provided on the rear case 360 and electrically connected to the second radiation conductor 613 through the second signal wiring 447a.

Figure 11:
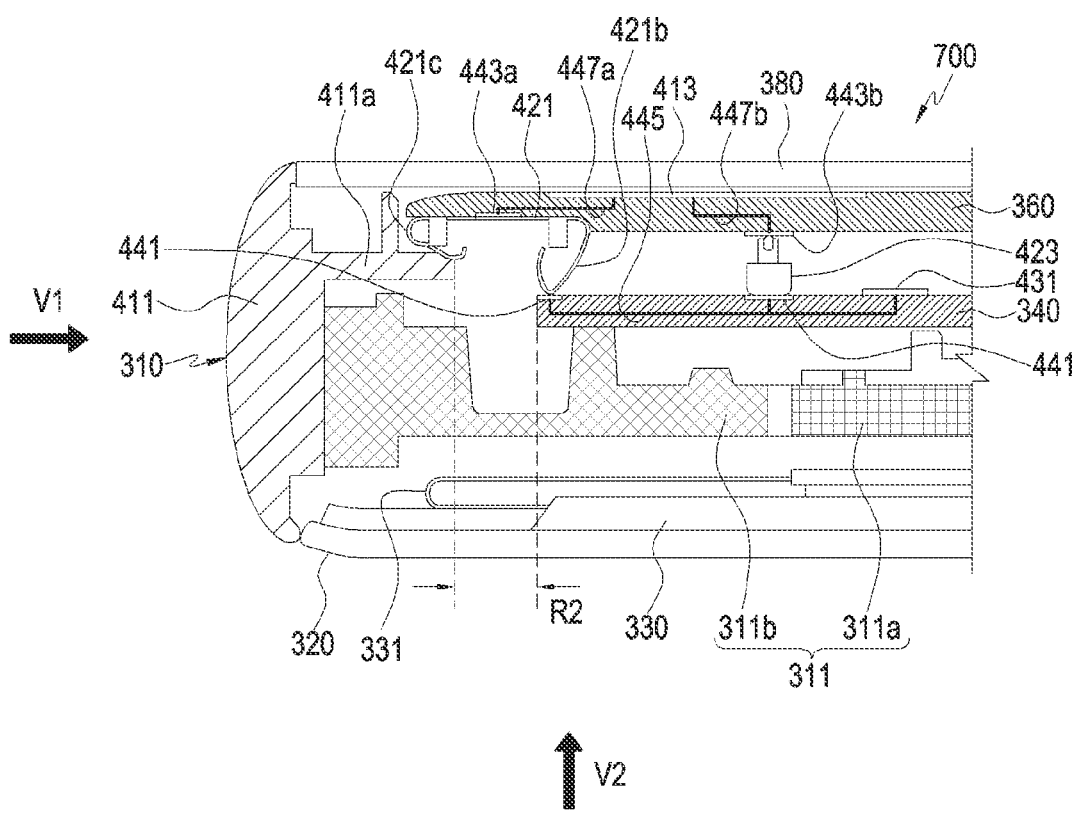
FIG. 11 is a cross-sectional view illustrating an example of the electronic device according to various embodiments.

FIG. 11 is a sectional view illustrating an example electronic device 700 (e.g., an example of the electronic devices 100, 300, and 400 of FIGS. 1 to 4) according to various embodiments.

It has been described before that the degree of design freedom is increased by mounting a first connection member (e.g., the first connection member 421 of FIG. 4) to a structure (e.g., the rear case 360 of FIG. 4) other than a circuit board (e.g., the circuit board 340 of FIG. 4). Referring to FIG. 11, compared to FIG. 4, a partial area (e.g., the first area R1 of FIG. 4) of the circuit board 340 may be removed. For example, the circuit board 340 may be miniaturized, and when a part of the circuit board 340 is not removed, the corresponding area may be used as an area for mounting other electronic components therein. In an embodiment, in the case where the partial area of the circuit board 340 is removed, when viewed from the front of the electronic device 700 in the arrowed direction V2, at least a part of the first curved part 421b may overlap with the circuit board 340, and at least a part of the second curved part 421c may overlap with a part of a first radiation conductor (e.g., the first radiation conductor 411 of FIG. 4), for example, the contact piece 411a. In an embodiment, as the partial area of the circuit board 340 is removed, an empty space, for example, a second area R2 may be formed between the first radiation conductor 411 and the circuit board 340. For example, when viewed from the front of the electronic device 700 in the arrowed direction V2, a part of the fixing part 421a may be disposed in the second area R2.

As described above, according to various example embodiments of the disclosure, an electronic device (e.g., the electronic device 100, 300, 400, and 700 of FIGS. 1 to 4 or FIG. 11) may include: a housing (e.g., the housing 110 of FIG. 1 or 2) including a front plate (e.g., the front plate 320 of FIG. 3 or FIG. 4), a rear plate disposed to face in a direction opposite the front plate (e.g., the rear plate 380 of FIG. 3 or 4), and a side bezel (e.g., the side bezel structure 310 of FIG. 3 or 4) at least partially surrounding a space between the front plate and the rear plate, a circuit board (e.g., the circuit board 340 of FIG. 3 or 4) disposed between the front plate and the rear plate, a first radiation conductor (e.g., the first radiation conductor 411 of FIG. 4) disposed to form at least a part of the side bezel, a connection member comprising a conductive material (e.g., the first connection members 421 and 521 of FIGS. 4 to 8) disposed between the circuit board and the rear plate, and a processor or communication module comprising communication circuitry (e.g., the integrated circuit chip 431 of FIG. 4) disposed on the circuit board, wherein the connection member includes a first curved part (e.g., the first curved part 421b of FIG. 6) provided at one end thereof and contacting the circuit board, and a second curved part (e.g., the second curved part 421c of FIG. 6) provided at another end thereof and contacting the first radiation conductor. The first radiation conductor may be electrically connected to the circuit board, and the processor or communication module may be configured to perform wireless communication in at least one frequency band using the first radiation conductor.

According to various example embodiments, the connection member may further include a flat plate-shaped fixing part (e.g., the fixing part 421a of FIG. 6). The first curved part may extend curvedly from one end of the fixing part, and the second curved part may extend curvedly from the other end of the fixing part.

According to various example embodiments, the second curved part may have a different height from the first curved part in a thickness direction of the electronic device (e.g., the thickness direction T of FIG. 4).

According to various example embodiments, the first curved part and the second curved part may extend toward the front plate and be disposed to at least partially face the fixing part.

According to various example embodiments, the first radiation conductor may include at least one contact piece (e.g., the contact piece 411a of FIG. 4) extending in parallel to the front plate from the inner surface of the side bezel structure, and the second curved part may contact the contact piece.

According to various example embodiments, the contact piece may be disposed at a smaller distance to the rear plate than a distance between the circuit board and the rear plate.

According to various example embodiments, the electronic device as described above may further include a rear case (e.g., the rear case 360 of FIG. 3 or 4) disposed between the rear plate and the circuit board, the fixing part may be mounted in the rear case, and at least a part of the connection member may be disposed to face the circuit board.

According to various example embodiments, the electronic device as described above may further include a second radiation conductor (e.g., the second radiation conductor 413 or 613 of FIG. 4 or FIG. 10) disposed in the rear case, and the fixing part may be electrically connected to the second radiation conductor.

According to various example embodiments, in the electronic device as described above, the fixing part may further include an extension piece (e.g., the extension piece 521a of FIG. 8 or FIG. 10) extending from at least one edge thereof, the second radiation conductor may be disposed on a surface of the rear case different from a surface of the rear case on which the connection member is disposed, and the extension piece may be connected to the second radiation conductor by penetrating through the rear plate.

According to various example embodiments, when viewed from the front of the electronic device, at least a part of the first curved part may overlap with the circuit board, a part of the second curved part may overlap with a part of the first radiation conductor, and a part of the fixing part may be disposed between the first radiation conductor and the circuit board.

According to various example embodiments, the connection member may further include at least one first support piece (e.g., the first support piece 421d of FIG. 6) extending from at least one edge of the fixing part, and the first support piece together with the fixing part may be shaped into a flat plate.

According to various example embodiments, the connection member may further include at least one second support piece (e.g., the second support piece 421e of FIG. 6) extending from at least one edge of the fixing part, and the second support piece may be formed to be inclined or perpendicular to the fixing part.

According to various example embodiments, the second support piece may be formed to have a smaller height than the first curved part or the second curved part in the thickness direction of the electronic device, and may be disposed adjacent to the first curved part or the second curved part.

According to various example embodiments, the electronic device as described above may further include a display (e.g., the display 330 of FIG. 3 or 4) disposed between the front plate and the circuit board, and a flexible printed circuit board (e.g., the flexible printed circuit board 331 of FIG. 4) extending from the display. When viewed from the front of the electronic device, a part of the flexible printed circuit board may overlap with the connection member.

According to various example embodiments, an electronic device may include: a housing including a front plate, a rear plate disposed to face a direction opposite the front plate, and a side bezel at least partially surrounding a space between the front plate and the rear plate, a circuit board disposed between the front plate and the rear plate, a first radiation conductor disposed to form at least a part of the side bezel, a connection member comprising a conductive material disposed between the rear plate and the circuit board, and a processor or a communication module comprising communication circuitry disposed on the circuit board. The connection member may include a first curved part at one end thereof, contacting the circuit board and a second curved part at another end thereof, contacting the first radiation conductor, to electrically connect the first radiation conductor to the circuit board, and the processor or the communication module is configured to perform wireless communication in at least one frequency band using the first radiation conductor.

According to various example embodiments, an electronic device may include: a housing including a front plate, a rear plate disposed to face a direction opposite the front plate, and a side bezel at least partially surrounding a space between the front plate and the rear plate, a circuit board disposed between the front plate and the rear plate, a rear case disposed between the rear plate and the circuit board, a first radiation conductor disposed to form at least a part of the side bezel, and a first connection member comprising a conductive material mounted in the rear case and disposed to at least partially face the circuit board. The first connection member may include a first curved part at one end thereof contacting the circuit board and a second curved part at another end thereof contacting the first radiation conductor, to electrically connect the first radiation conductor to the circuit board.

According to various example embodiments, the electronic device may further include a rear case disposed between the rear plate and the circuit board, the first connection member may be mounted in the rear case, and at least a part of the first connection member may be disposed to face the circuit board.

According to various example embodiments, the electronic device may further include a second radiation conductor disposed in the rear case, and the first connection member may be electrically connected to the second radiation conductor.

According to various example embodiments, the electronic device may further include a processor or a communication module comprising communication circuitry, and the processor or the communication module may be configured to perform wireless communication in at least one frequency band using the first radiation conductor and/or the second radiation conductor.

According to various example embodiments, the electronic device may further include a second connection member comprising a conductive material disposed in the circuit board, and the second connection member may electrically connect the second radiation conductor to the circuit board.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:
1. An electronic device comprising:
 a housing including a front plate, a rear plate disposed to face a direction opposite the front plate, and a side bezel at least partially surrounding a space between the front plate and the rear plate;

a circuit board disposed between the front plate and the rear plate;

a rear case disposed between the rear plate and the circuit board;

a first radiation conductor disposed to form at least a part of the side bezel;

a connection member comprising a conductive material disposed between the rear plate and the circuit board, and at least partially disposed to face the circuit board; and a processor or a communication module comprising communication circuitry disposed on the circuit board, wherein the connection member includes:
a flat plate-shaped fixing part mounted in the rear case;
a first curved part extending curvedly from one end of the fixing part and contacting the circuit board, and
a second curved part extending curvedly from another end of the fixing part and contacting the first radiation conductor, to electrically connect the first radiation conductor to the circuit board, and wherein the processor or the communication module is configured to perform wireless communication in at least one frequency band using the first radiation conductor.

2. The electronic device claim 1, wherein the first curved part and the second curved part have different heights in a thickness direction of the electronic device.

3. The electronic device claim 1, wherein the first curved part and the second curved part extend toward the front plate and are disposed to at least partially face the fixing part.

4. The electronic device claim 1, wherein the first radiation conductor includes at least one contact piece extending in parallel to the front plate from an inner surface of the side bezel, and the second curved part contacts the contact piece.

5. The electronic device claim 4, wherein the contact piece is disposed at a distance to the rear plate that is less than a distance between the circuit board and the rear plate.

6. The electronic device claim 1, further comprising a second radiation conductor disposed in the rear case,
wherein the fixing part is electrically connected to the second radiation conductor.

7. The electronic device claim 6, wherein the fixing part further includes an extension piece extending from at least one edge thereof, the second radiation conductor is disposed on a surface of the rear case different from a surface of the rear case on which the connection member is disposed, and the extension piece is connected to the second radiation conductor by penetrating through the rear plate.

8. The electronic device claim 1, wherein when viewed from a front of the electronic device, at least a part of the first curved part overlaps with the circuit board, a part of the second curved part overlaps with a part of the first radiation conductor, and a part of the fixing part is disposed between the first radiation conductor and the circuit board.

9. The electronic device claim 1, wherein the connection member further includes at least one support piece extending from at least one edge of the fixing part, and the first support piece forms a flat plate together with the fixing part.

10. The electronic device claim 1, wherein the connection member further includes at least one second support piece extending from at least one edge of the fixing part, and the second support piece is inclined or perpendicular to the fixing part.

11. The electronic device claim 10, wherein the second support piece has a height less than a height of the first curved part or the second curved part in the thickness direction of the electronic device and is disposed adjacent to the first curved part or the second curved part.

12. The electronic device claim 1, further comprising:
a display disposed between the front plate and the circuit board; and
a flexible printed circuit board extending from the display, wherein when viewed from a front of the electronic device, a part of the flexible printed circuit board at least partially overlaps with the connection member.

* * * * *